United States Patent [19]

Muramatsu

[11] Patent Number: 5,761,208

[45] Date of Patent: Jun. 2, 1998

[54] EXPANSIBLE HIGH SPEED DIGITAL MULTIPLEXER

[75] Inventor: John J. Muramatsu, Carlsbad, Calif.

[73] Assignee: Brooktree Corporation, San Diego, Calif.

[21] Appl. No.: 725,733

[22] Filed: Oct. 4, 1996

Related U.S. Application Data

[63] Continuation of Ser. No. 393,180, Feb. 23, 1995, abandoned, which is a continuation of Ser. No. 980,223, Nov. 23, 1992, abandoned.

[51] Int. Cl.$^6$ ............................................. H04J 3/00
[52] U.S. Cl. ........................ 370/532; 370/540; 340/870.13
[58] Field of Search ................................ 370/498, 499, 370/532, 533, 535, 537, 538, 539, 540, 541; 340/870.11, 870.13, 870.14

[56] References Cited

U.S. PATENT DOCUMENTS

| | | | |
|---|---|---|---|
| 3,535,458 | 10/1970 | Gottfried et al. | 370/537 |
| 4,542,500 | 9/1985 | Jean-Claude | 370/540 |
| 4,551,634 | 11/1985 | Takahashi et al. | 370/532 |
| 4,817,090 | 3/1989 | Pfennings et al. | 370/540 |
| 4,829,518 | 5/1989 | Iguchi et al. | 370/540 |
| 4,932,027 | 6/1990 | Scharrer | 370/540 |
| 5,136,587 | 8/1992 | Obana et al. | 370/535 |

*Primary Examiner*—Douglas W. Olms
*Assistant Examiner*—Ricky Q. Ngo
*Attorney, Agent, or Firm*—William C. Cray; Susie H. Oh

[57] ABSTRACT

A multiplexer, preferably on an integrated circuit chip, receives a plurality of buses each having a plurality of lines responsive to binary indications and passes the binary indications in the lines of a particular one of the buses. The multiplexer includes a plurality of circuit blocks each responsive to the binary indications in the lines of an individual one of the buses. Each block has a plurality of recursive circuits each having first and second stages. The second stages of the recursive circuits in an individual one of the circuit blocks receive an individual one of a plurality of control indications at a first side of the block to activate the first stages in such recursive circuits. The first stage in each recursive circuit in each individual circuit block receives at a second side of the block the binary indications in an individual line in an individual one of the buses to obtain a signal from such first stage in accordance with such binary indication upon the activation of such first stage. The output lines of the same binary significance in the different circuit blocks are connected in an OR relationship. Each output circuit in a plurality is responsive to the signals in the OR relationship of an individual binary significance from the recursive circuit in the activated block to provide output signals from the multiplexer. The multiplexer accordingly provides a recursive and expansible, arrangement for passing signals at each instant from a selected bus without any wire crossovers.

30 Claims, 6 Drawing Sheets

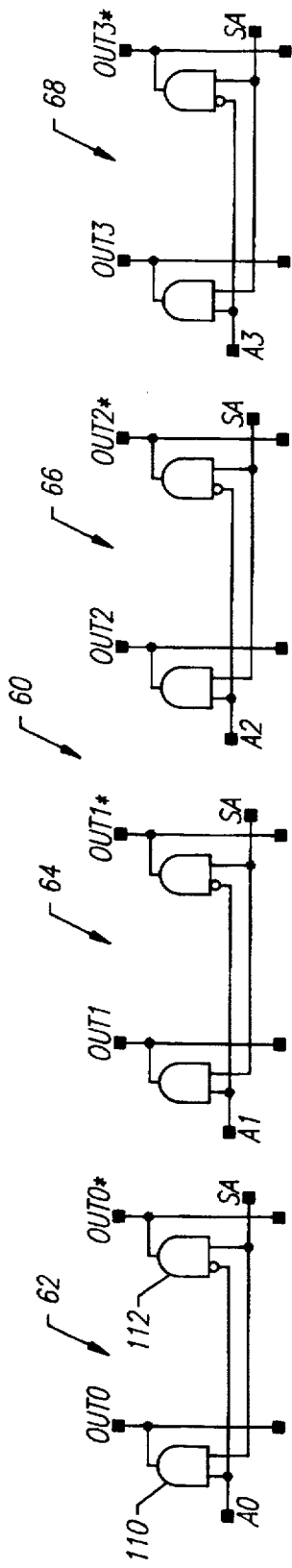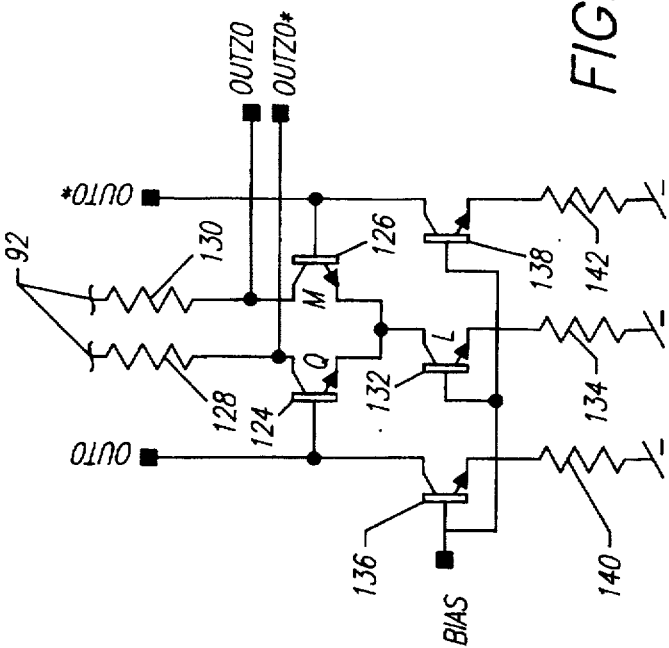
FIG. 4
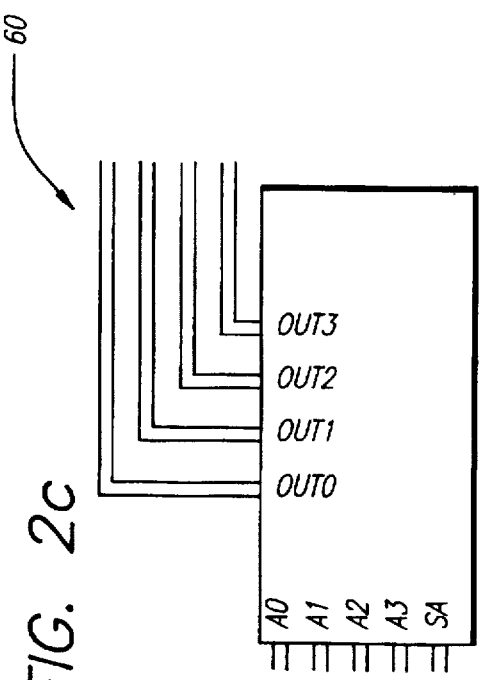
FIG. 2b
FIG. 2c

EXPANSIBLE HIGH SPEED DIGITAL MULTIPLEXER

This is a continuation of application Ser. No. 08/393,180 filed Feb. 23, 1995, now abandoned, which in turn is a continuation of Ser. No. 07/980,223 filed Nov. 23, 1992, now abandoned.

This invention relates to multiplexers and more particularly to an expansible high speed digital multiplexer. The invention particularly relates to a multiplexer which is recursive and expansible and which can be formed on an integrated circuit chip without any wire crossovers.

A high speed digital multiplexer accepts digital data from the lines of a plurality of buses. Each line in each bus provides digital data of an individual binary significance. For example, the first line in each bus provides digital data of the least binary significance and the last line in each bus provides digital data of the greatest binary significance. At each instant, the multiplexer routes the digital data from only a selected one of the buses to an output bus. As will be appreciated, the selected bus may vary at different times.

Digital multiplexers constructed in the prior art from "Emitter Coupled Logic" (or ECL) have been limited in construction. In such prior art multiplexers, the lines of the same binary significance from the different buses have been connected in a selection circuit which is in the form of a tree with branches. When the tree has four lines each from a different bus, a first selection is made between a first pair of branches in which there are two (2) lines in each branch. A selection is then made in the selected branch between the two (2) lines in such branch. A similar arrangement is provided in selection circuits for the lines of the same individual binary significance in the different buses, each selection circuit being operative on the lines of an individual binary significance. In this way, the digital data from the lines of a selected one of the buses is able to pass through the multiplexer at each instant.

The digital multiplexer described in the previous paragraph has certain significant disadvantages. One significant disadvantage results from the connection of the lines of the same binary significance from the different buses in a selection circuit defined by the branches of a tree. Because of this connection, the control voltages providing for the selection between the lines in the different pairs of branches have had to have progressive values. Since the energizing voltage for the selection circuit has only a limited value, the need for the control voltages of progressive values has limited the head room in the selection circuit. This has limited the number of branches which can be provided in any selection circuit.

Another disadvantage has resulted from the connection of the lines of the same binary significance from the different buses in a selection circuit. This disadvantage has been particularly prominent when the selection circuits for the lines of different binary significance have been disposed on an integrated circuit chip. Because the lines from each individual bus have had to be connected in individual selection circuits, there have had to be a multitude of crossovers in the lines. This has unduly complicated the integrated circuit chip. Furthermore, the distributed capacitances produced in the crossovers of the lines have limited the frequencies of the multiplexers in the prior art.

The limited frequencies have been especially disturbing when the multiplexers have been used in automatic test equipment since the test equipments have had to operate at frequencies at least as high as the frequencies of the integrated circuit chips being tested in order to provide valid tests on such chips. As will be appreciated, the frequencies of circuits on integrated circuit chips have progressively increased as the thickness of the lines on the integrated circuit chips has progressively decreased.

This invention provides a multiplexer which overcomes the disadvantages discussed above. In the multiplexer, circuit blocks (or selection circuits) are provided in which each circuit block receives only the digital data in the lines of one of a plurality of buses. In each circuit block, a plurality of recursive circuits are provided each operative on the digital data in an individual one of the lines in the associated bus.

Since the circuits in each circuit block are recursive and independent, the number of circuits in each circuit block can be expanded to any desired value in accordance with the number of lines in the associated bus. Furthermore, since only the lines from the associated bus are connected to each individual circuit block, there is no crossover of lines when the circuit blocks are disposed on an integrated circuit chip.

In one embodiment of the invention, a multiplexer, preferably on an integrated circuit chip, receives a plurality of buses each having a plurality of lines responsive to binary indications and passes the binary indications in the lines of a particular one of the buses. The multiplexer includes a plurality of circuit blocks each responsive to the binary indications in the lines of an individual one of the buses.

Each circuit block has a plurality of recursive circuits each having first and second stages. The second stages of the recursive circuits in an individual one of the circuit blocks receive an individual one of a plurality of control indications at a first side of the circuit block to activate the first stages in such recursive circuits. The first stage in each recursive circuit in each individual circuit block receives at a second side of the circuit block the binary indications in an individual line in an individual one of the buses to obtain a signal from such first stage in accordance with such binary indication upon the activation of such first stage.

The output lines of the same binary significance in the different circuit blocks are connected in an OR relationship. Each output circuit in a plurality is responsive to the signals in the OR relationship of an individual binary significance from the recursive circuit in the activated circuit block to provide output signals from the multiplexer. The multiplexer accordingly provides a recursive and expansible arrangement for passing signals at each instant from a selected bus without any wire crossovers.

In the drawings:

FIG. 2b is a simplified circuit diagram of the selection circuit (or circuit block) shown in FIG. 2b;

FIG. 2c is a further simplified circuit diagram of the simplified selection circuit (or circuit block) shown in FIG. 2b;

Figures 1, 2A:
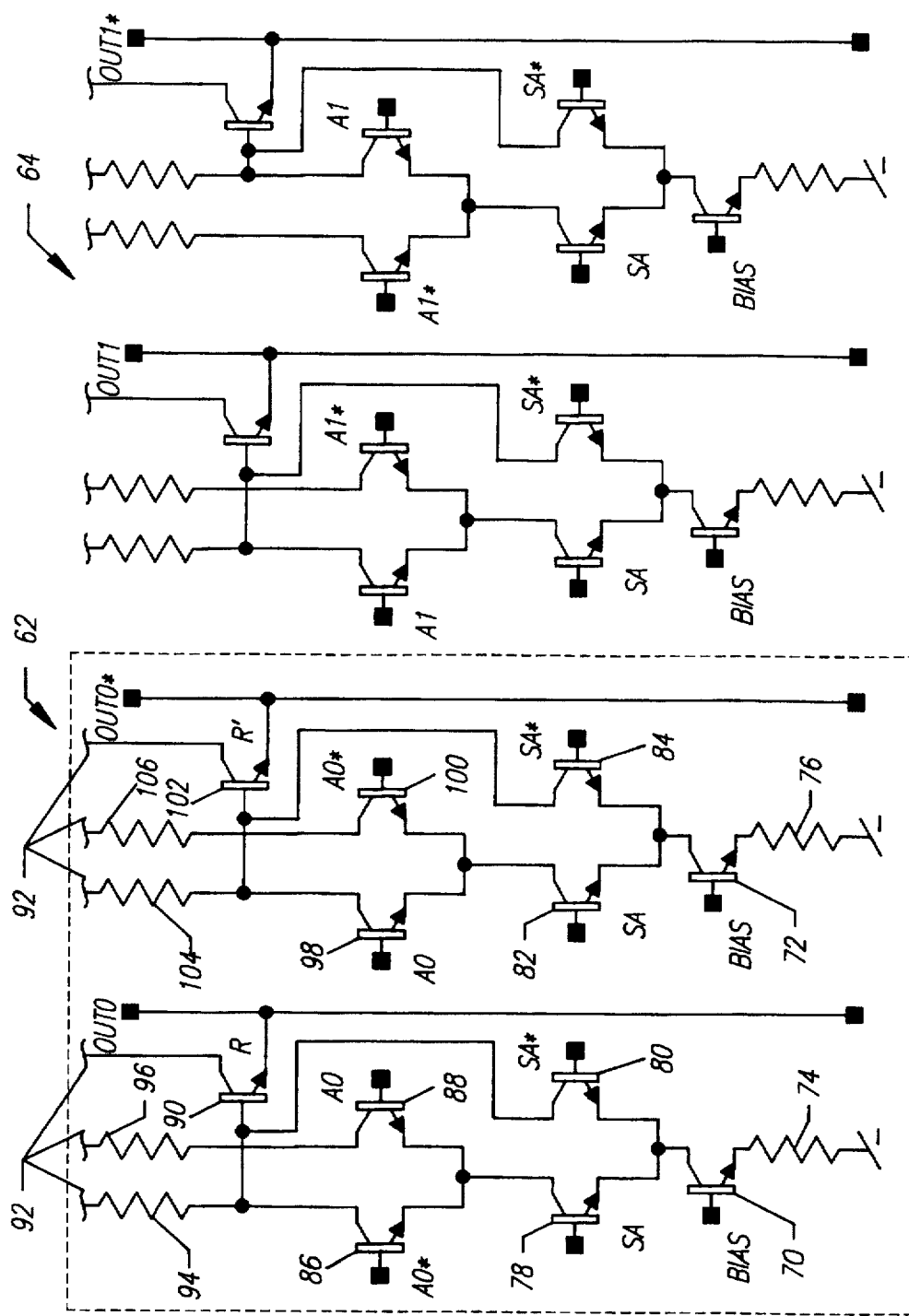
FIG. 2a is a circuit diagram of a selection circuit (or circuit block) in a multiplexer constituting one embodiment of this invention.
Figure 3:
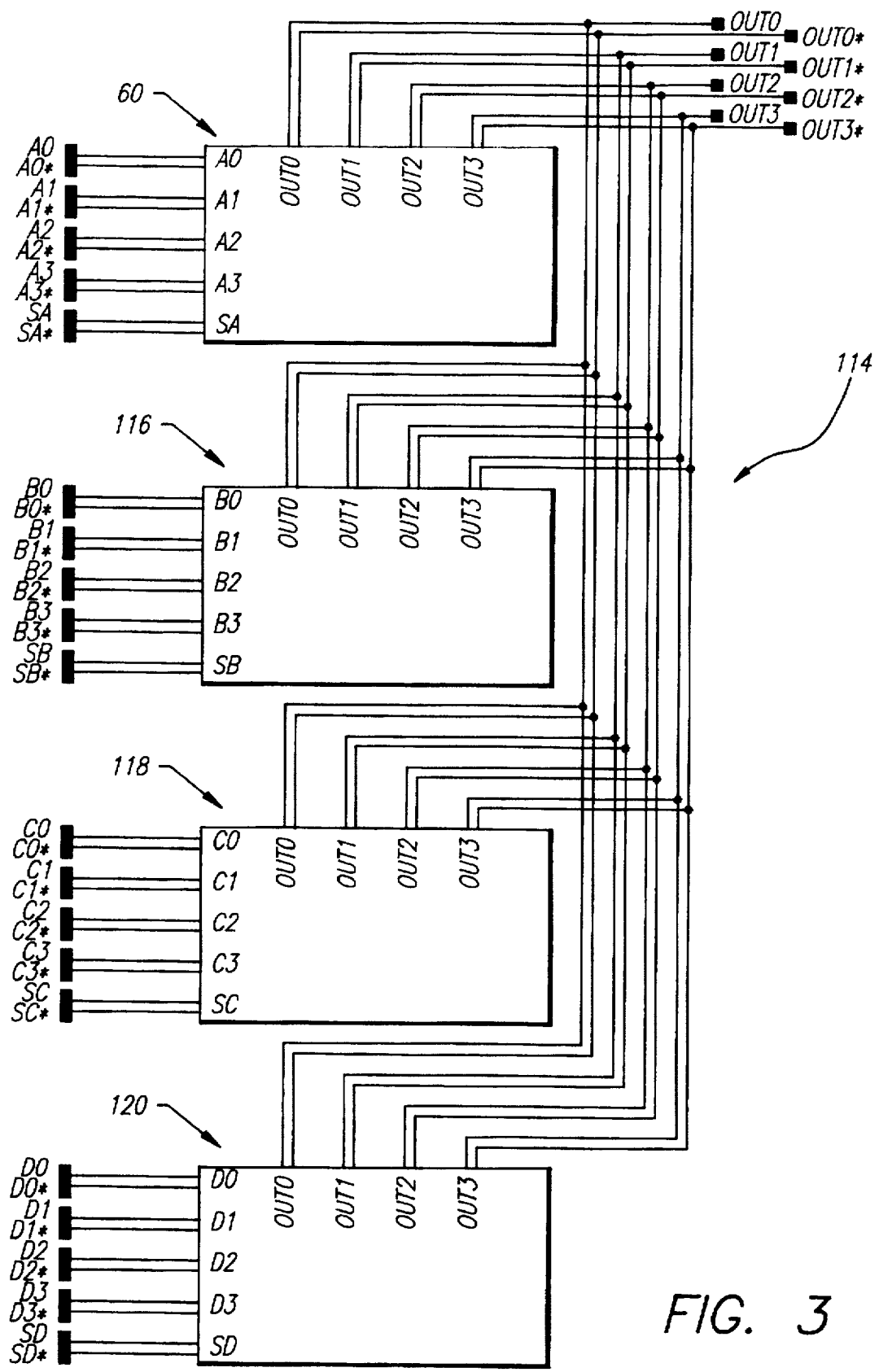

FIG. 3 is a simplified circuit diagram of the multiplexer constituting one embodiment of this invention and illustrates the interrelationship between pairs of output lines of a number of the simplified circuit blocks shown in FIG. 2c; and FIG. 4 is a circuit diagram of an output circuit associated with a pair of the output lines shown in FIG. 3 to obtain the passage of an output signal from the multiplexer.

FIG. 1 illustrates a selection circuit, generally indicated at 10, in a multiplexer of the prior art. In this selection circuit, lines A0 and A0* of a least binary significance are provided in a first bus; lines B0 and B0* of the least binary significance are provided in a second bus; lines C0 and C0* of the least binary significance are provided in a third bus; and lines D0 and D0* of the least binary significance are provided in a fourth bus. The voltages on the lines A0, B0, C0 and D0 are respectively complementary to the voltages on the lines A0*, B0*, C0* and D0*.

The lines A0*, A0, B0*, B0, C0*, C0, D0* and D0 are respectively connected to the gates of transistors 12, 14, 16, 18, 20, 22, 24 and 26. These transistors may be bipolar transistors of the npn type. The collectors of the transistors 12, 16, 20 and 24 may be connected through a resistor 32 to a source 30 of positive voltage and the collectors of the transistors 14, 18, 22 and 26 are connected through a resistor 28 to the voltage source 30.

The emitters of the transistors 12 and 14 have a common connection with the collector of a transistor 34, the emitters of the transistors 16 and 18 with the collector of a transistor 36, the emitters of the transistors 20 and 22 with the collector of a transistor 38 and the emitters of the transistors 24 and 26 with the collector of a transistor 40. The transistors 34, 36, 38 and 40 may be bipolar transistors of the npn type. The bases of the transistors 34 and 38 receive a control voltage S0* and the bases of the transistors 36 and 40 receive a complementary control voltage S0.

The emitters of the transistors 34 and 36 are common with the collector of a transistor 42 and the emitters of the transistors 38 and 40 are common with the collector of a transistor 44. The transistors 42 and 44 may be bipolar transistors of the npn type. The bases of the transistors 42 and 44 respectively receive control voltages S1* and S1 in the order of approximately −1.6 volts to approximately −2.0 volts. A common connection is made from the emitters of the transistors 42 and 44 to the collector of a transistor 46, which may be a bipolar transistor of the npn type. The base of the transistor 46 receives a bias voltage to make the transistor conductive. The emitter of the transistor 46 receives a reference potential through a resistor 48.

The bias voltage on the base of the transistor 46 may have a suitable value such as approximately −3.2 to −3.5 volts. This voltage should be more negative than the highest voltage on the emitters of the transistors 42 and 44. The voltage on the base of the transistor 46 is more positive than the voltage on the emitter of the transistor 46 so as to make the transistor conductive. The difference between the voltages on the base and emitter of the transistor 46 is approximately 0.8V.

When a control voltage S1* in the order of approximately −1.6 volts is introduced to the base of the transistor 42, the transistor becomes conductive because the voltage on the base of this transistor is more positive than the voltage on the emitter of the transistor, the voltage on the emitter being approximately −2.4V. The transistor 44 likewise becomes conductive when a control voltage S1 in the order of approximately −1.6 volts is introduced to the base of this transistor. The other transistor in the pair comprising the transistors 42 and 44 becomes non-conductive because it receives a voltage of approximately −2.0V. on its base when the conductive transistor in the pair receives a voltage of approximately −1.6 volts on its base.

In like manner, a voltage of approximately −0.8 volts is introduced to the bases of the transistor 34 and 38 when the control voltage S0* is true, and a voltage of approximately −1.2 volts is simultaneously introduced to the bases of the transistors 36 and 40 to make these transistors non-conductive. Similarly, the bases of the transistors 36 and 40 receive a voltage in the order of −0.8 volts when the control voltage S0 is true and the bases of the transistors 34 and 38 simultaneously receive a voltage of approximately −1.2 volts. The individual ones of the transistors 34, 36, 38 and 40 become conductive depending upon the pattern of the control voltages, S0, S0*, S1 and S1*.

When each individual one of the transistors 34, 36, 38 and 40 becomes conductive, it introduces a negative voltage respectively to pairs of transistors 12 and 14, transistors 16 and 18, transistors 20 and 22 and transistors 24 and 26 to activate the respective pairs of transistors. For example, the transistors 12 and 14 become activated when the transistor 34 becomes conductive. When a voltage between approximately 0 volts and −0.4 volts is illustratively introduced to the base of the transistor 14 to represent a binary indication of A0, the transistor 14 becomes conductive to produce a voltage on the output line OUT. Similarly, an output voltage is produced on the OUT* line when a voltage between approximately 0 volts and −0.4 volts is introduced to the base of the transistor 12 to represent the complementary binary indication of A0*.

Figure 1A:
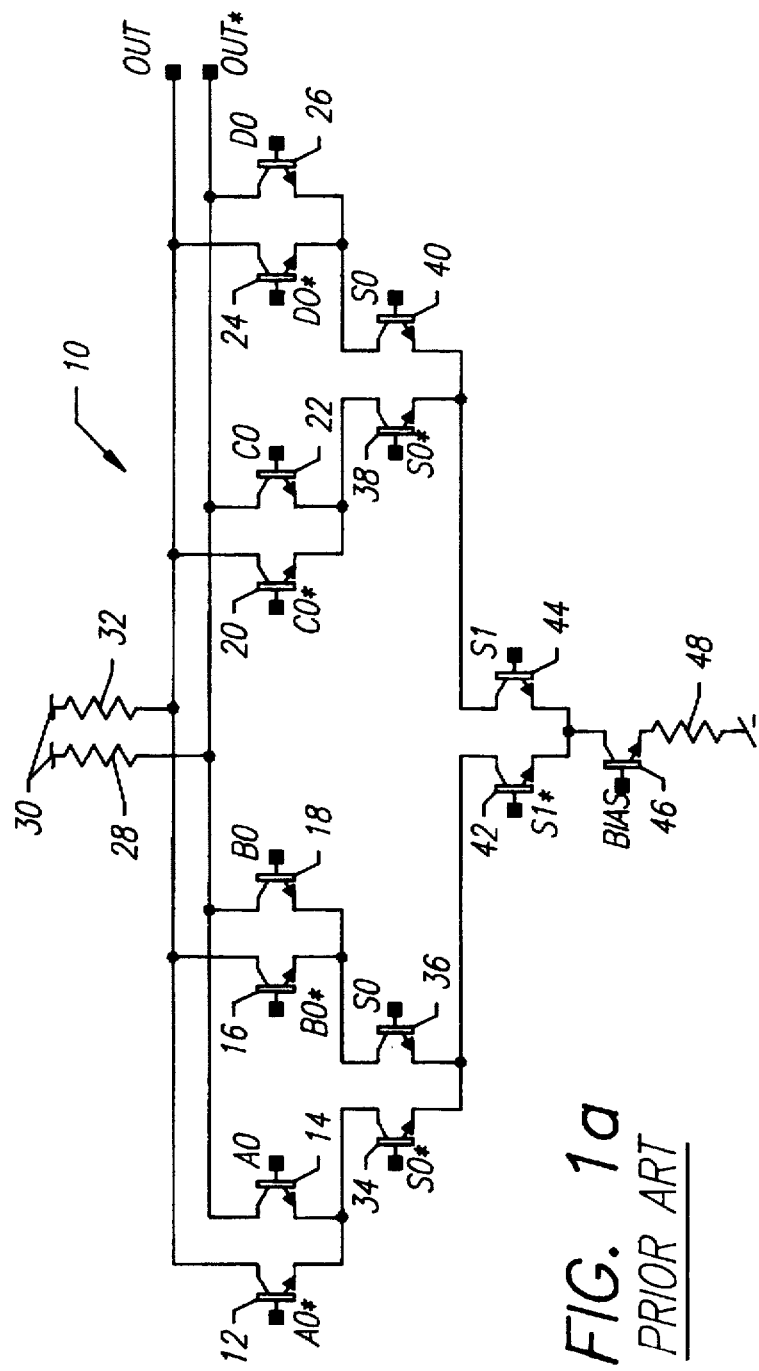
FIG. 1a is a circuit diagram of a selection circuit included in a multiplexer of the prior art.

As will be seen, the selection circuit 10 shown in FIG. 1a and described above is not expansible. This results from the voltages of progressively positive magnitude applied to the bases of the transistors in the progressive stages—(a) the transistor 46, (b) the transistors 42 and 44, (c) the transistors 34, 36, 38 and 40 (d) and the transistors 12–26 (even numbers only). Because of these progressively positive magnitudes on the bases of the transistors in four (4) successive stages, there is no headroom to add a fifth stage. If there were a fifth stage, the collector of each of the transistors 12–26 (even numbers only) would be connected to the emitters of pairs of transistors in a fifth (5th) stage.

Figure 1B:
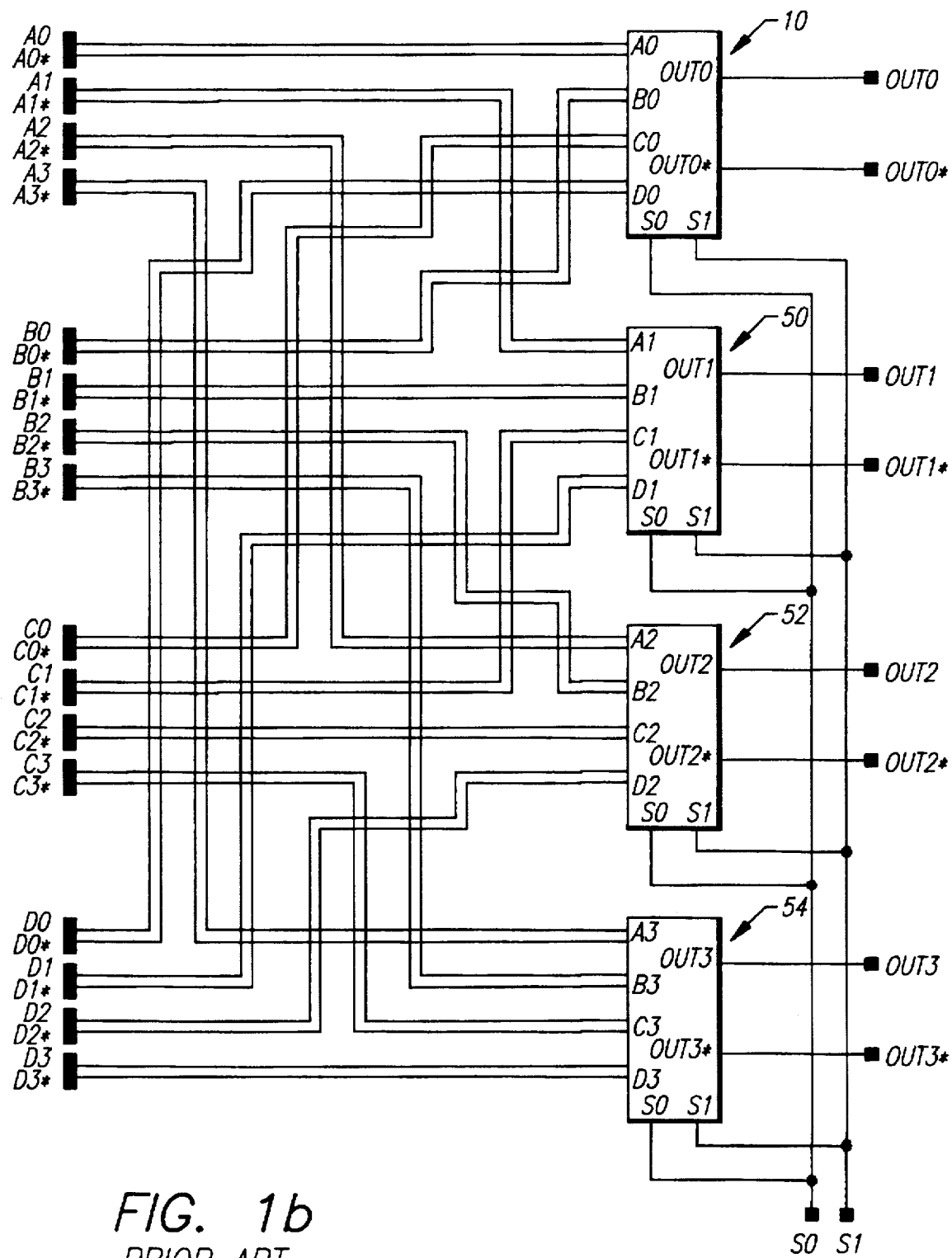
FIG. 1b is a schematic circuit diagram of a plurality of selection circuits in the multiplexer of the prior art and illustrates the wire crossovers required to make the connections to the different selection circuits.

The selection circuit 10 is shown schematically as a single block in FIG. 1b to provide output indications on output lines OUT0 and OUT0* of the least binary bits in buses A, B, C and D. Similarly, circuit blocks 50, 52 and 54 respectively provide output indications on lines OUT1 and OUT1*, on OUT2 and OUT2* and on OUT3 and OUT3*. The indications on these lines respectively represent the outputs of the second, third and fourth least significant binary indications in the buses A, B, C and D.

Since the lines from each bus pass to the selection circuits 10, 50, 52 and 54, there is a significant crossover of lines. This is shown in FIG. 1b. These crossovers unduly complicate the construction of the integrated circuit chip on which the selection circuits 10, 50, 52 and 54 are located. They also tend to increase the distributed capacitances significantly, primarily in the inputs to the blocks 10, 50, 52 and 54, since distributed capacitors are created between each individual pair of line crossovers. These distributed capacitances limit the maximum frequency at which the circuitry on the integrated circuit block can operate.

Figures 2, 2A:
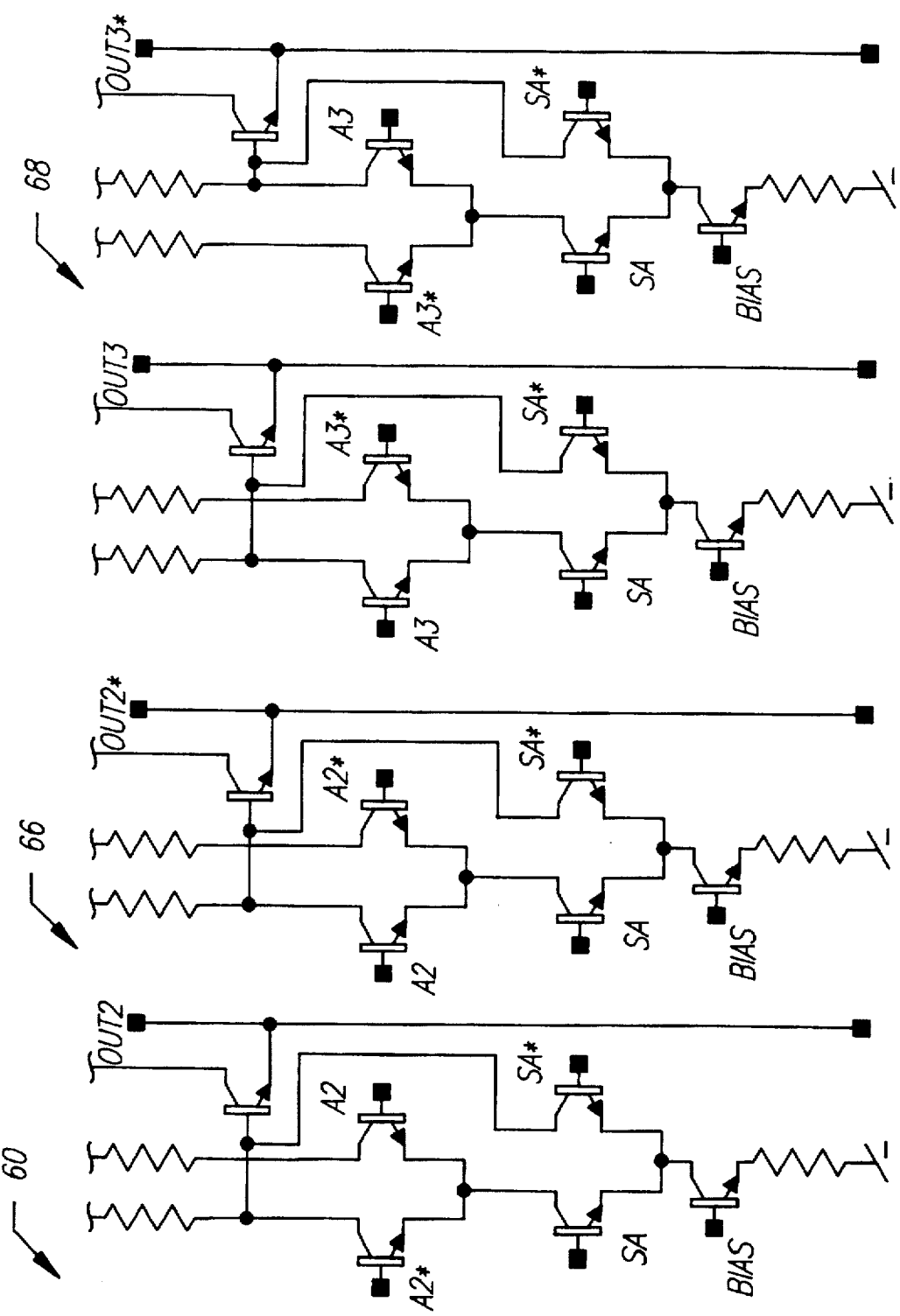

The construction on an integrated circuit chip of multiplexers such as shown in FIGS. 1 and 2 has become of increasing concern since frequencies of circuits on integrated circuit chips have progressively increased as the micron size of the lines on the chips has progressively decreased. The multiplexers of the prior art have accordingly provided a bottleneck in maximizing the frequency outputs from the integrated circuit chips.

The multiplexer shown in FIGS. 1a and 1b and described above is limited to a selection between four (4) buses. If it is desired to select between eight (8) buses, a second multiplexer is required to select between the additional four (4) buses. A third multiplexer is then required to select between the outputs of the first and second multiplexers. Since a selection between more than four (4) different buses is becoming an increasing requirement, the limitations represented by the multiplexer of the prior art have become of increasing concern.

The multiplexer constituting one embodiment of this invention and shown in FIGS. 2, 3 and 4 overcomes the disadvantages described above. It can be expanded to any number of lines in each bus and can be expanded to any number of buses. It is formed from recursive circuits which are independent of one another in their operation. These independent recursive circuits facilitate the expansibility of the multiplexer to a selection between any number of buses and any number of lines in each bus. The multiplexer of this invention is also advantageous in that there are no line crossovers in the multiplexer in the connection of the different lines in the different buses to the circuitry in the multiplexer.

In the multiplexer constituting one embodiment of this invention, a plurality of circuit blocks are provided each responsive to the binary indications in the lines of an individual one of the buses. Each circuit block is constructed from recursive circuits so that each circuit block is identical in construction to the other circuit blocks. One of the circuit blocks is generally indicated at 60 in FIGS. 2a, 2b and 2c.

The circuit block 60 is formed from a plurality of recursive circuits of identical construction. One of these recursive circuits is generally indicated at 62 in FIGS. 2a and 2b. The recursive circuit 62 is responsive to the binary indications on the lines A0 and A0* to provide output indications on lines OUT0 and OUT0*. Identical recursive circuits generally indicated at 64, 66 and 68 are respectively responsive to the binary indications on lines A1 and A1*, on lines A2 and A2* and on lines A3 and A3* to provide output indications on lines OUT1 and OUT1*, on lines OUT2 and OUT2 * and on lines OUT3 and OUT3*. The binary indications on the lines A0 and A0* are of the least binary significance, the binary indications on the lines A1 and A1* are of the second least binary significance; and the binary indications on the lines A2 and A2* and on the lines A3 and A3* are respectively of the third and fourth least binary significances.

The recursive circuit 62 is formed from a plurality of transistors each of which may be a bipolar transistor of the npn type. These transistors include a pair of transistors 70 and 72 each of which receives a bias voltage on its base to make the transistor conductive. The emitters of the transistors 70 and 72 are respectively connected to first terminals of resistors 74 and 76, second terminals of which receive a reference potential.

Connections are made from the collector of the transistor 70 to the emitters of transistors 78 and 80 and from the collector of the transistor 72 to the emitters of transistors 82 and 84. The bases of the transistors 78 and 82 receive a control signal SA and the bases of the transistors 80 and 84 receive a complementary control signal SA*. The complementary control signals SA and SA* are also introduced to the bases of transistors in the recursive circuits 64, 66 and 68 corresponding to the transistors 78, 80, 82 and 84 in the recursive circuit 62. As will be described subsequently in further detail, the recursive circuits 62, 64, 66 and 68 are activated by the control signal SA but are deactivated by the control signal SA*.

The voltage on the collector of the transistor 78 is introduced to the emitters of transistors 86 and 88. The bases of the transistors 86 and 88 respectively receive the binary indications on the lines A0* and A0. The collector of the transistor 86 is common with the base of a transistor 90 as is the collector of the transistor 80. The output line OUT0 has a common connect ion with the emitter of the transistor 90. The collector of the transistor 90 receives an energizing voltage directly from a voltage source 92. The collectors of the transistors 86 and 88 respectively receive the energizing voltage from the source 92 through resistors 94 and 96.

In like manner, the collector of the transistor 82 is common with the emitters of transistors 98 and 100. The base of the transistor 98 receives the binary indications on the line A0 and the base of the transistor 100 receives the binary indications on the line A0*. The collector of the transistor 98 is connected to the base of a transistor 102 as is the collector of the transistor 84. The voltage on the line OUT0* is obtained from the emitter of the transistor 102. The collector of the transistor 102 receives the voltage directly from the source 92 and the collectors of the transistors 98 and 100 receive the voltages from the source 92 respectively through resistors 104 and 106.

The bias voltage on the bases of the transistors 70 and 72 causes these transistors to be conductive. The resultant voltages on the emitters of the transistors 78, 80, 82 and 84 place these transistors in a state to be activated in accordance with the voltages on the bases of these transistors. When a voltage of a high logic level is produced on the line SA* to indicate that the recursive circuit 60 is not being selected for multiplexing, the transistors 80 and 84 become conductive to produce a relatively low voltage on the collectors of these transistors. The transistors 90 and 102 are always conductive. When a relatively low voltage is produced on the collectors of the transistors 80 and 84, the resultant low voltages on the bases of the transistors 90 and 102 cause relatively low voltages to be produced on the output lines OUT0 and OUT0*. Similarly, the voltage of high logic level on the line SA* causes low voltages to be produced on the output lines OUT1 and OUT1*, the output lines OUT2 and OUT2* and the output lines OUT3 and OUT3*.

When the voltage on the line A0 is high and the voltage on the line SA is simultaneously high, the transistor 98 becomes conductive. This causes a low voltage to be produced on the collector of the transistor 98 and to be introduced to the base of the transistor 102. This prevents the transistor 102 from conducting and accordingly causes a low voltage to be produced on the line OUT0*. At the same time that a high voltage is produced on the line A0, a complementary low voltage is produced on the line A0*. This low voltage prevents the transistor 86 from conducting. Because of this, the relatively high voltage from the source 92 is introduced to the base of the transistor 90 to insure that the transistor is fully conductive. The resultant flow of a large current through the transistor 90 from the source 92 causes a voltage of a relatively high magnitude to be produced on the output line OUT0. This output voltage on the line OUT0 is the voltage on the base of the transistor 90 minus the voltage drop between the base and emitter of the transistor.

In like manner, a relatively high voltage on the line A0* causes the transistor 86 to become conductive. The resultant low voltage on the collector of the transistor 86, and therefore on the base of the transistor 90, causes a low voltage to be produced on the output line OUT0. At the same time that a high voltage is produced on the line A0*, a complementary low voltage is produced on the line A0. This low voltage prevents the transistor 98 from being conductive. The resultant introduction of the high voltage to the base of the transistor 102 insures that the transistor is fully conductive so that the voltage on the base of the transistor, minus the base-emitter voltage drop, is introduced to the output line OUT0*.

The recursive circuits 64, 66 and 68 operate in the same manner as described above when the control indication SA is introduced to these recursive circuits. For example, an output voltage of high magnitude is produced on the output line OUT1 when a voltage of high logic is produced on the line A1. Similarly, an output voltage of a high magnitude is produced on the output line OUT1* when a voltage of a high logic level is produced on the line A1*.

The recursive circuits shown in FIG. 2a may be illustratively simplified to the recursive circuits shown in FIG. 2b. For example, the recursive circuits 62 may be simplified to a pair of AND networks 110 and 112. The AND network 110 may have inputs from the lines A0 and SA and may produce an output on the line OUT0. The voltage on the line A0 may be inverted to form the complementary voltage A0* and this complementary voltage may be introduced to the AND network 112. When the AND network 112 also receives the control indications on the line SA, the AND network provides an output on the line OUT0*.

FIG. 2c illustrates a simplified version of the circuit block 60 relative to that shown in FIG. 2b. FIG. 2C also illustrates the architecture of the circuit block 60 on an integrated circuit chip which is illustrated schematically at 114 in FIG. 3. As shown schematically in FIG. 2c, the lines A0, A0*, A1, A1*, A2, A2*, A3 and A3* are connected to the circuit block 60 at the left side of the circuit block 60 and the control lines SA and SA* are connected to the circuit block at the left side of the circuit block. The output lines OUT0, OUT0*, OUT1, OUT1*, OUT2, OUT2*, OUT3 and OUT3* extend from the top singular of the circuit block, in FIG. 2c. As will be seen, there is no crossover of lines connected to the circuit block 60.

FIG. 3 illustrates the disposition of the circuit block 60 and a plurality of additional circuit blocks, generally indicated at 116, 118 and 120, on the integrated circuit chip 114. As will be seen, the circuit blocks 116, 118 and 120 singular respectively activated when they receive control indications SB, SC and SD. When the circuit block 116 becomes activated, it passes selective ones of binary indications B0, B0*, B1, B1*, B2, B2*, B3 and B3*. The binary indications B0 and B0*, the binary indications B1 and B1*, the binary indications B2 and B2* and the binary indications B3 and B3* respectively represent progressive binary significances. These progressive binary significances correspond to the progressive significances of the binary indications with the same designations in FIG. 1b. Similarly, the circuit block 118 passes selective ones of binary indications C0, C0*, C1, C1*, C2, C2*, C3 and C3* when it becomes activated by the control indication SC. The circuit block 120 likewise passes selective ones of binary indications D0, D0*, D1, D1*, D2, D2*, D3 and D3* when it becomes activated by the control indication SD.

Only one of the control indications SA, SB, SC and SD is activated at any instant. The selection of the individual one of the control indications SA, SB, SC and SD to be activated at each instant may be provided by control apparatus external to the system shown in FIG. 5. Such selection may be provided at each instant by such control apparatus on the basis of criteria individual to such control apparatus or on the basis of criteria determined by data processing apparatus to which such control apparatus is connected.

The circuit blocks 116, 118 and 120 are arranged on the integrated circuit chip 114 in a manner similar to the arrangement of the circuit block 60 on the chip. In other words, the control indications SB, SC and SD are respectively introduced to the left sides of the circuit block 116, 118 and 120. The binary indications B0-B3 and B0*-B3*, the binary indications C0-C3 and C0*-C3* and the binary indications D0-D3 and D0*-D3* are respectively introduced to the left sides of the circuit blocks 116, 118 and 120.

The circuit blocks 60, 116, 118 and 120 are preferably arranged on the chip 114 in an aligned relationship such as shown in FIG. 3. In this arrangement, the output indications extend in FIG. 3 from the top end of the blocks. The output indications from each of the blocks 60, 116, 118 and 120 are respectively indicated as OUT0, OUT0*, OUT1, OUT1*, OUT2, OUT2*, OUT3 and OUT3*. The output lines of the same binary significance from the circuit blocks 60, 116, 118 and 120 extend upwardly from the blocks and then to the right. The output lines of the same binary significance from the circuit blocks 60, 116, 118 and 120 are then connected in a wired OR configuration. For example, the output lines OUT0 from the circuit blocks 60, 116, 118 and 120 are connected in a wired OR configuration. Similarly, the output lines OUT3 from the circuit blocks 60, 116, 118 and 120 are connected in a wired OR configuration.

In a wired OR configuration, an output indication from any one of the lines constitutes the output of the wired OR configuration. For example, an output on the OUT0 line from the circuit block 116 constitutes the output from the wired OR configuration of least binary significance when the circuit block 116 is activated by a control indication on the line SB. Similarly, an output on the OUT2* line from the circuit block 118 constitutes the output from the wired OR configuration of the third least binary significance when the circuit block 118 is activated by a control indication on the line SC. Only one output indication is provided at each instant on each of the output lines OUT0, OUT0*, OUT1, OUT1*, OUT2, OUT2*, OUT3, OUT3* since only one of the blocks 60, 116, 118 and 120 is activated at that instant.

FIG. 4 illustrates a circuit for producing output signals on lines OUTZ0 and OUTZ0* when output indications are respectively provided on the output lines OUT0 and OUT0* from the wired OR configurations of least binary significance. It will be appreciated that output circuits similar to that shown in FIG. 4 will be provided for the output lines OUT1 and OUT1*, the output lines OUT2 and OUT2* and the output lines OUT3 and OUT3*.

In FIG. 4, the output lines OUT0 and OUT0* are respectively connected to the bases of transistors 124 and 126, which may be bipolar transistors of the npn type. The collectors of the transistors 124 and 126 respectively receive energizing voltages from the source 92 through resistors 128 and 130. The output lines OUTZ0 and OUTZ0* are respectively connected to the collectors of the transistors 124 and 126. The emitters of the transistors 124 and 126 are common with the collector of a transistor 132 which may be a bipolar transistor of the npn type.

The emitter of the transistor 132 is connected to a reference potential through a resistor 134. The emitters of transistors 136 and 138 are respectively connected to the reference potential through resistors 140 and 142. The bases of the transistors 132, 136 and 138 receive a bias voltage on the bases of the transistors to make the transistors is conductive. The collectors of the transistors 136 and 138 are respectively common with the bases of the transistors 124 and 126.

The bias voltage on the bases of the transistors 132, 136 and 138 produces a state of conductivity in these transistors. This causes a relatively low voltage to be introduced from the collector of the transistor 132 to the emitters of the transistors 124 and 126 to prepare the transistors 124 and 126 to become activated. One of the circuit blocks 60, 116, 118 and 120 is always selected at each instant since the circuitry shown in the drawings is a multiplexer. The selected circuit block will output a logical high voltage on one of the output lines and a logical low voltage on the other output line for each individual binary indication. For example, since OUT0 and OUT0* are complementary for the selected block, a high voltage on the line OUT0 for the selected block will force a low voltage to be produced on the line OUT0* for that block.

When an output voltage is produced on the line OUT0 for the selected block, this voltage is introduced to the base of the transistor 124 to make this transistor conductive. A low voltage is accordingly produced on the output line OUTZ0*. However, the line OUTZ0 has a high voltage because the transistor 126 is non-conductive and because the energizing voltage from the source 92 is introduced to the OUTZ0* line. Similarly, when a positive voltage is produced on the OUT0* line for a selected block, the transistor 126 becomes conductive to produce a low voltage on the line OUTZ0. At the same time, a high voltage is produced on the line OUTZ0* because the transistor 124 is non-conductive.

The multiplexer described above and shown in FIGS. 2, 3 and 4 has certain important advantages. As will be seen from FIGS. 2a, 2b and 2c, the multiplexer includes a plurality of circuit blocks such as the blocks 60, 116, 118 and 120 each formed from a plurality of recursive circuits such as the recursive circuit 62. Each of the circuit blocks 60, 116, 118 and 120 is in dependent of the other circuit blocks and each of the recursive circuits in each circuit block is independent of the other recursive circuits in such circuit block. As a result, the number of circuit blocks in the multiplexer is easily expansible and the number of recursive circuits in each circuit block is easily expansible.

Furthermore, as shown in FIG. 3 and as described above, the circuit blocks such as the circuit blocks 60, 116, 118 and 120 (and any expansible number of circuit blocks) can be disposed on the integrated circuit chip 114 without any wire crossovers in the input leads to the circuit blocks. This minimizes the circuitry on the chip and also minimizes the distributed capacitances in the chip. As a result, the frequency capable of being attained in providing the multiplexing action can be maximized.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. A multiplexer, including, a plurality of buses each having a plurality of first lines for receiving binary indications of different binary significances and each having control lines for controlling the selection of the first lines in that bus for the passage of such binary significances, a plurality of circuit blocks each responsive to the binary indications of the different binary significances in the first lines of an individual one of the buses, first means for introducing, in a first direction to an associated one of the circuit blocks, the binary indications of the different binary significances in the lines in an individual one of the buses, second means for introducing in the first direction, to the control lines in an individual one of the circuit blocks, control indications individual to such circuit block for providing a controlled processing of the binary indications of the different binary significances in such circuit block in accordance with such control indications, circuit means in each of the circuit blocks for processing, in accordance with the control indications introduced to such circuit block, the binary indications of the different binary significances introduced to such block, and output means responsive to the processing of the binary indications of the different binary significances in each of the circuit blocks for passing the processed binary indications from such block in a second direction transverse to the first direction, each of the circuit blocks being formed in a recursive arrangement in which the circuit means in each individual one of the circuit blocks corresponds to the circuit means in each of the other circuit blocks and in which the circuit means for each individual one of the binary indications of the different binary significances in such block has the same construction as the circuit means for the binary indications of the other binary significances in such block.

2. A multiplexer, including, a plurality of buses each having a plurality of first lines for receiving binary indications of different binary significances and each having control lines for controlling the selection of the first lines in that bus for the passage of such binary significances, a plurality of circuit blocks each responsive to the binary indications of the different binary significances in the first lines of an individual one of the buses, first means for introducing, in a first direction to an associated one of the circuit blocks, the binary indications of the different binary significances in the lines in an individual one of the buses, second means for introducing in the first direction, to the control lines in an individual one of the circuit blocks, control indications individual to such circuit block for providing a controlled processing of the binary indications of the different binary significances in such circuit block in accordance with such control indications, circuit means in each of the circuit blocks for processing, in accordance with the control indications introduced to such circuit block, the binary indications of the different binary significances introduced to such block, and output means responsive to the processing of the binary indications of the different binary significances in each of the circuit blocks for passing the processed binary indications from such block in a second direction transverse to the first direction, each of the circuit means in each individual one of the circuit blocks including means responsive to the control indications for such individual one of the blocks for activating such circuit means only upon the introduction of the control indications to such circuit block.

3. In a multiplexer as set forth in claim 1, including, the circuit means in each of the circuit blocks constituting first circuit means, the output means including a plurality of second circuit means in which each of such second circuit means corresponds to the other ones of the second circuit means.

4. A multiplexer as set forth in claim 3, including, the first circuit means including first circuitry responsive to a first logic level in each individual one of the binary indications of the different binary significances for producing a first output signal and including second circuitry responsive to binary indications of a second logic level in each individual one of the binary indications of the different binary significances for producing a second output signal, the first and second circuitry having substantially identical constructions for each individual one of the binary indications of the different binary significances.

5. A multiplexer, including, a plurality of buses each having a plurality of first lines responsive to binary indications of different binary significances for passing such binary indications through the multiplexer, a plurality of circuit blocks each connected to receive the binary indications of the different binary significances in the lines of an individual one of the buses, each of the circuit blocks being isolated electrically from the other circuit blocks, means for providing a plurality of control indications each individual to an individual one of the circuit blocks to obtain an activation of such individual one of the circuit blocks only upon the occurrence of the one of the control indications individual to such circuit block, circuit means in each of the circuit blocks for processing, only upon the activation of such circuit block by the one of the control indications individual to such circuit block, the binary indications of the different binary significances introduced to such circuit block from the first lines of the individual one of the buses to obtain resultant indications representative of the binary indications in the lines of such individual one of the buses, and a plurality of output means each responsive to the resultant indications of the same individual binary significance from the different circuit blocks for processing such resultant indications to obtain an output indication for such individual binary significance.

6. A multiplexer, including, a plurality of buses each having a plurality of first lines responsive to binary indications of different binary significances for passing such binary indications through the multiplexer, a plurality of circuit blocks each connected to receive the binary indications of the different binary significances in the lines of an individual one of the buses, each of the circuit blocks in the plurality being isolated electrically from the other circuit blocks in the plurality, means for providing a plurality of control indications each individual to an individual one of the circuit blocks to obtain an activation of such individual one of the circuit blocks, circuit means in each of the circuit blocks for processing, upon the activation of such circuit block, the binary indications of the different binary significances introduced to such circuit block from the first lines of the individual one of the buses to obtain resultant indications representative of the binary indications in the lines of such individual one of the buses, and a plurality of output means each responsive to the resultant indications of the same individual binary significance from the different circuit blocks for processing such resultant indications to obtain an output indication for such individual binary significance, each of the circuit blocks being formed from a plurality of recursive circuits, each of the recursive circuits in each of the circuit blocks being responsive to the binary indications of an individual one of the binary indications of the different binary significances in such circuit block.

7. A multiplexer, including, a plurality of buses each having a plurality of first lines responsive to binary indications of different binary significances for passing such binary indications through the multiplexer, a plurality of circuit blocks each connected to receive the binary indications of the different binary significances in the lines of an individual one of the buses, each of the circuit blocks in the plurality being isolated electrically from the other circuit blocks in the plurality, means for providing a plurality of control indications each individual to an individual one of the circuit blocks to obtain an activation of such individual one of the circuit blocks, circuit means in each of the circuit blocks for processing, upon the activation of such circuit block, the binary indications of the different binary significances introduced to such circuit block from the first lines of the individual one of the buses to obtain resultant indications representative of the binary indications in the lines of such individual one of the buses, and a plurality of output means each responsive to the resultant indications of the same individual binary significance from the different circuit blocks for processing such resultant indications to obtain an output indication for such individual binary significance, each of the binary indications of the different binary significances having binary logic levels, the first lines in each circuit block being provided in pairs, each pair of the first lines in each circuit block being responsive to the binary logic levels of an individual one of the indications of the different binary significances for such circuit block, each of the circuit blocks being formed from a plurality of recursive circuits connected in a paired relationship, each of the pairs of recursive circuits in each of the circuit blocks being responsive to the binary logic levels of the pair of lines of an individual one of the binary indications of different binary significances in such circuit block.

8. A multiplexer as set forth in claim 7, including, each of the recursive circuits in each of the circuit blocks including a first stage responsive to the control indications for such circuit block to become activated and including a second stage responsive to the binary logic levels of an individual one of the binary indications of the different binary significances and responsive to the activation of the first stage in such recursive circuit to obtain the output indication from such recursive circuit.

9. A multiplexer, including, a plurality of buses each having a plurality of first lines responsive to binary indications of different binary significances for passing such binary indications through the multiplexer and each having control lines for selectively activating the first lines in such bus, a plurality of circuit blocks each responsive to the binary indications from the first lines in an associated one of the buses, a plurality of recursive circuits in each circuit block, each of the recursive circuits in each circuit block being responsive to an individual one of the binary indications of the different binary significances in the individual one of the buses, means for providing a plurality of control indications each operative for coupling to the control lines of an individual one of the buses to control the activation of the recursive circuits in the associated one of the circuit blocks and to provide for the production by the recursive circuits in such individual one of the circuit blocks of resultant signals in accordance with the binary indications of the different binary significances in the lines in the associated one of the buses, and a plurality of output means each responsive to the resultant signals of corresponding binary significance from the circuit blocks for providing an output dependent upon the characteristics of the different ones of such resultant signals of corresponding binary significance.

10. A multiplexer as set forth in claim 9, including, the recursive circuits in each circuit block being provided in pairs, each of the binary indications of the different binary significances in the lines in each bus having first and second logic levels, each of the recursive circuits in each pair in each circuit block being respectively responsive to the first and second logic levels of the binary indications in an individual one of the lines in such circuit block to provide outputs dependent upon such logic levels when the recursive circuits are activated.

11. A multiplexer as set forth in claim 10, including, each of the output means including a circuit responsive to the resultant signals produced for the first and second logic levels of an individual one of the binary indications of the different binary significances in the circuit blocks to provide outputs in accordance with such resultant signals.

12. A multiplexer as set forth in claim 11, including, the resultant signals from the recursive circuits in the circuit blocks being introduced in a common relationship to an individual one of the output means, for the binary indications of corresponding binary significance in such circuit blocks, to provide an output when one of such binary indications has the first logic level in the block with the activated recursive circuits.

13. A multiplexer as set forth in claim 9, including, the resultant signals from the recursive circuits in the blocks being introduced in a common relationship to an individual one of the output means, for the binary indications of corresponding binary significance in such circuit blocks, to provide the output for such corresponding binary significance in accordance with the resultant signals from the recursive circuits for the binary indications of such corresponding binary significance in such circuit blocks and in accordance with the activation of the recursive circuits in the individual one of the circuit blocks.

14. A multiplexer, including, a plurality of buses each having a plurality of first lines responsive to binary indications of different binary significances for passing such binary indications through the multiplexer and each having control lines for selectively activating the first lines in such bus, a plurality of first means for providing a plurality of control indications, each of the first means being associated with the control lines in an individual one of the buses to activate the first lines in such bus, a plurality of circuit blocks each including a first stage associated with an individual one of the buses for providing an activation of the first lines in such circuit block in accordance with the control indications in the associated one of the first means and each including a second stage responsive to the activation of the first lines in such circuit block to provide resultant indications in accordance with the binary indications of the different binary significances in the first lines in such individual one of the buses, each of the circuit blocks having first and second sides and first and second ends, second means for introducing the binary indications of the different binary significances in the lines in each individual one of the buses to the first side of the associated circuit block, third means for introducing the control indications in the control lines in each individual ones of the buses to the first side of the associated circuit block, fourth means for providing the resultant indications for the binary indications of the different binary significances for each circuit block from the first end of the circuit block, and a plurality of fifth means each responsive to the resultant indications from the first ends of the circuit blocks for the binary indications of an individual one of the different binary significances for providing an output indication in accordance with such resultant indications in the activated one of the circuit blocks.

15. A multiplexer, including, a plurality of buses each having a plurality of first lines responsive to binary indications of different binary significances for passing such binary indications through the multiplexer and each having control lines for selectively activating the first lines in such bus, a plurality of first means for providing a plurality of control indications, each of the first means being associated with the control lines in an individual one of the buses to activate the first lines in such bus, a plurality of circuit blocks each associated with an individual one of the buses for providing an activation of the first lines in such circuit block in accordance with the control indications in the associated one of the first means to provide resultant indications in accordance with the binary indications of the different binary significances in the first lines in such individual one of the buses, each of the circuit blocks having first and second sides and first and second ends, second means for introducing the binary indications of the different binary significances in the lines in each individual one of the buses to the first side of the associated circuit block, third means for introducing the control indications in the control lines in each individual ones of the buses to the first side of the associated circuit block, fourth means for providing the resultant indications for the binary indications of the different binary significances for each circuit block from the first end of the circuit block, and a plurality of fifth means each responsive to the resultant indications from the first ends of the circuit blocks for the binary indications of an individual one of the different binary significances for providing an output indication in accordance with such resultant indications in the activated one of the circuit blocks, each of the resultant indications having first and second logic levels, each of the fifth means being responsive in an OR arrangement to the resultant indications from the different circuit blocks for the individual one of the binary indications of the different binary significances for providing the first logic level in the output indications for such individual one of binary indications when such resultant indication in the activated one of the circuit blocks has the first logic level, each of the circuit blocks being formed from a plurality of circuits each responsive to the indications in an individual one of the lines in the bus associated with such circuit block and each being recursive with respect to the other circuits in that block and in the other blocks.

16. A multiplexer as set forth in claim 14, including, each individual one of the binary indications of the different binary significances having first and second logic levels, the lines in each bus being paired to provide complementary first and second logic levels on the lines in the pair, the resultant indications from each of the circuit blocks being paired and the resultant indications in each pair in each such circuit block being provided on a pair of output lines to provide first and second logic levels in such pair of output lines in accordance with such resultant indications, each individual one of the fifth means being responsive in a wired OR relationship to the resultant indications from the circuit blocks for the pairs of lines of an individual one of the different binary significances for providing the first logic level in the output indications from such individual one of the fifth means when one of the resultant indications for the lines in one of such pairs in the activated one of the circuit blocks has the first logic level.

17. A multiplexer as set forth in claim 15, including, each of the fifth means including means for biasing such fifth means to prevent the output indications from being produced by the fifth means except in response to the resultant indications from the circuit blocks.

18. A multiplexer, including, a plurality of buses each having a plurality of first lines responsive to binary indications of different binary significances for passing such binary indications through the multiplexer and each having control lines for activating the first lines in such bus, means for providing a plurality of control indications each for introduction to the control lines in an individual one of the buses, a plurality of circuit blocks each including a plurality of circuit means, each of the circuit means including a first stage responsive to an individual one of the control indications from the control lines in an individual one of the buses to provide an activating signal and each of the circuit means being responsive to the binary indications of the different binary significances from the first lines in such individual one of the buses for providing resultant indications representing the binary indications of the different binary significances from the first lines in such individual one of the buses, and a plurality of output means each responsive to the resultant indications of an individual one of the different binary significances from the circuit blocks for providing an output indication of such resultant indications when such resultant indications are from the first lines activated by the control indications.

19. A multiplexer, including, a plurality of buses each having a plurality of first lines responsive to binary indications of different binary significances for passing such binary indications through the multiplexer and each having control lines for activating the first lines in such bus, means for providing a plurality of control indications each for introduction to the control lines in an individual one of the buses, a plurality of circuit blocks each responsive to an individual one of the control indications from the control lines in an individual one of the buses and to the binary indications of the different binary significances from the first lines in such individual one of the buses for providing resultant indications representing the binary indications of the different binary significances, and a plurality of output means each responsive to the resultant indications of an individual one of the different binary significances from the circuit blocks for providing an output indication of such resultant indications when such resultant indications are from the first lines activated by the control indications, each of the circuit blocks including a plurality of recursive means each responsive to an individual one of the binary indications of the different binary significances in such circuit block for providing the resultant indications representing such individual one of such binary indications.

20. A multiplexer, including, a plurality of buses each having a plurality of first lines responsive to binary indications of different binary significances for passing such binary indications through the multiplexer and each having control lines for activating the first lines in such bus, means for providing a plurality of control indications each for introduction to the control lines in an individual one of the buses, a plurality of circuit blocks each responsive to an individual one of the control indications from the control lines in an individual one of the buses and to the binary indications of the different binary significances from the first lines in such individual one of the buses for providing resultant indications representing the binary indications of the different binary significances, and a plurality of output means each responsive to the resultant indications of an individual one of the different binary significances from the circuit blocks for providing an output indication of such resultant indications when such resultant indications are from the first lines activated by the control indications, the resultant indications of the different binary significances in each circuit block being provided in an OR relationship with the resultant indications of such individual one of the binary indications of the different binary significances in the other circuit blocks, each of the output means including circuitry responsive in the OR relationship to the resultant indications for the individual one of the binary indications of the different binary significances in the circuit blocks for providing an output indication of such resultant indications when such resultant indications are from the first lines activated by the control indications.

21. A multiplexer, including, a plurality of buses each having a plurality of first lines responsive to binary indications of different binary significances for passing such binary indications through the multiplexer and each having control lines for activating the first lines in such bus, means for providing a plurality of control indications each for introduction to the control lines in an individual one of the buses, a plurality of circuit blocks each responsive to an individual one of the control indications from the control lines in an individual one of the buses and to the binary indications of the different binary significances from the first lines in such individual one of the buses for providing resultant indications representing the binary indications of the different binary significances, and a plurality of output means each responsive to the resultant indications of an individual one of the different binary significances from the circuit blocks for providing an output indication of such resultant indications when such resultant indications are from the first lines activated by the control indications, each of the circuit blocks including a plurality of recursive means each responsive to an individual one of the binary indications of the different binary significances and each responsive to the control indications individual to such circuit block for providing the resultant indications representing such individual one of such different binary indications, each of the recursive means including a first stage responsive to the control indications individual to such circuit block for providing a signal in accordance with such control indications and including a second stage responsive to the signal from the first stage and responsive to the individual one of the binary indications of the different binary significances for providing the resultant indications representing such binary indications.

22. A multiplexer, including, a plurality of buses each having a plurality of first lines responsive to binary indications of different binary significances for passing such binary indications and each having control lines for activating the first lines, a plurality of circuit blocks each constructed to receive the binary indications in the lines of an associated one of the buses, means for providing a plurality of control indications each having a first logic level to indicate the occurrence of a control and having a second logic level to indicate the lack of occurrence of such control, each individual one of the control indications being introduced to the control lines in an individual one of the buses, each of the circuit blocks including a plurality of recursive circuits, each of the recursive circuits in each circuit block including first and second stages, means for introducing the first and second logic levels of each individual one of the control indications to the second stage in each of the recursive circuits in the associated one of the circuit blocks to obtain a first control signal upon the occurrence of the first logic level in such control indication and to obtain a second control signal upon the occurrence of the second logic level in such control indication, the lines in each bus being paired to provide in the lines in each pair binary indications having first and second complementary logic levels, each of the recursive circuits in each individual one of the circuit blocks being paired with another one of the recursive circuits in such individual one of the circuit blocks, there being pairs of output lines each connected to the first stages in an individual one of the pairs of recursive circuits in each individual one of the circuit blocks, and means for introducing the complementary logic levels of the binary indications in each pair of lines in each bus to the first stages in an individual one of the pairs of the recursive circuits in the individual one of the circuit blocks to obtain the production of output signals on the output lines connected to the first stages in such individual one of the pairs of recursive circuits upon the occurrence of the first control signal for such circuit block and in accordance with the complementary logic levels of such binary indications.

23. A multiplexer as set forth in claim 22, including, the recursive circuits in each of the circuit blocks having the same construction as the recursive circuits in other ones of the circuit blocks, each of the circuit blocks having output lines corresponding to the output lines in the other ones of the circuit blocks, the output lines in each of the circuit blocks being paired and being connected to the first stages in the pairs of the recursive circuits in such circuit block, the pairs of the output lines of each individual one of the different binary significances in each circuit block being connected in an OR relationship to the pairs of the output lines of such individual one of the different binary significances in the other ones of the circuit blocks.

24. A multiplexer as set forth in claim 23, including, a plurality of output circuits each connected in an OR relationship to the pairs of the output lines of an individual one of the different binary significances in the circuit blocks to provide the output signals when there is a signal on one of such output lines in the circuit block providing the first control signal.

25. A multiplexer as set forth in claim 24, including, each of the output circuits including stages connected to prevent the output signals from being produced in such output circuit except upon the introduction of a signal in the OR relationship to the individual one of the pairs of output lines of the individual one of the different binary significances from the circuit block providing the first control signal.

26. A multiplexer, including, a plurality of buses each having a plurality of first lines responsive to binary indications of different binary significances for passing the binary indications through the multiplexer and each having control lines for activating the first lines, a plurality of circuit blocks each responsive to the binary indications in the first lines of an individual one of the buses, each of the circuit blocks having a plurality of recursive circuits each responsive to the binary indications of an individual one of the different binary significances in the individual one of the buses, each of the recursive circuits having first and second stages, means for providing a plurality of control indications each providing a control in the operation of the recursive circuits in an individual one of the circuit blocks, means for introducing each control indication to the second stages in the recursive circuits in the individual one of the circuit blocks to provide for the activation of the first stages in such individual one of the circuit blocks, means for introducing the binary indications in each of the first lines in each individual one of the buses to the first stage in an individual one of the recursive circuits in the associated circuit block to obtain resultant signals from such first stage in accordance with such binary indications upon the activation of such first stage, and means responsive to the resultant signals from the first stages in the recursive circuits of corresponding binary significance in the circuit blocks for providing output signals in accordance with such resultant signals.

27. A multiplexer as set forth in claim 26, including, the resultant signals from the first stages in the recursive circuits in each circuit block being provided in output lines each having an individual binary significance, the output lines of the corresponding binary significance in the circuit blocks being connected in an OR relationship, and a plurality of output signal means each responsive to the resultant signals in the OR relationship of an individual one of the different binary significances from the circuit blocks for providing the output signals in accordance with such resultant signals in the activated one of the circuit blocks.

28. A multiplexer as set forth in claim 26, including, the circuit blocks being disposed on an integrated circuit chip and being provided with first and second sides and first and second ends, the means for introducing the control indications to the control lines in each circuit block being disposed on the first side of such circuit block.

the means for introducing the binary indications to the first lines in each circuit block being disposed on the first side of such circuit block.

the output lines for each circuit block being provided at the first end of such circuit block.

29. A multiplexer as set forth in claim 28, including, the circuit blocks being disposed on an integrated circuit chip, the circuit blocks being substantially aligned on the integrated circuit chip.

30. A multiplexer as set forth in claim 28, including, the OR relationship for the output lines of each individual binary significance from the circuit blocks being provided at the second side of such circuit blocks.

\* \* \* \* \*